US011621373B2

(12) United States Patent
Weiss

(10) Patent No.: US 11,621,373 B2
(45) Date of Patent: Apr. 4, 2023

(54) OPTOELECTRONIC COMPONENT AND METHOD FOR PRODUCING AN OPTOELECTRONIC COMPONENT

(71) Applicant: OSRAM OLED GMBH, Regensburg (DE)

(72) Inventor: Guido Weiss, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 616 days.

(21) Appl. No.: 16/635,376

(22) PCT Filed: Jun. 29, 2018

(86) PCT No.: PCT/EP2018/067603
§ 371 (c)(1),
(2) Date: Jan. 30, 2020

(87) PCT Pub. No.: WO2019/025091
PCT Pub. Date: Feb. 7, 2019

(65) Prior Publication Data
US 2020/0203574 A1 Jun. 25, 2020

(30) Foreign Application Priority Data
Aug. 3, 2017 (DE) .......................... 102017117613.6

(51) Int. Cl.
*H01L 21/00* (2006.01)
*H01L 33/38* (2010.01)
*H01L 33/22* (2010.01)

(52) U.S. Cl.
CPC ............ *H01L 33/382* (2013.01); *H01L 33/22* (2013.01); *H01L 2933/0016* (2013.01)

(58) Field of Classification Search
CPC ................... H01L 33/382; H01L 33/22; H01L 2933/0016
See application file for complete search history.

(56) References Cited

U.S. PATENT DOCUMENTS

2009/0065900 A1 3/2009 Saito et al.
2011/0073894 A1 3/2011 Chu et al.
(Continued)

FOREIGN PATENT DOCUMENTS

| EP | 1727217 A2 | 11/2006 |
| EP | 2549330 A1 | 1/2013 |
| EP | 2743997 A2 | 6/2014 |

OTHER PUBLICATIONS

International Search Report and Written Opinion of the International Searching Authority, dated Sep. 19, 2018, in related International Application No. PCT/EP2018/067603, 15 pages.

*Primary Examiner* — Richard A Booth
(74) *Attorney, Agent, or Firm* — MH2 Technology Law Group LLP

(57) ABSTRACT

The invention relates to an optoelectronic device (100) comprising a semiconductor layer sequence (1) on a carrier (7), the semiconductor layer sequence (1) comprising at least one n-doped semiconductor layer (11), at least one p-doped semiconductor layer (12) and an active layer (13) sandwiched between the p- and n-doped semiconductor layers (11, 12), an reconnecting contact (2), which is configured for electrically contacting the n-doped semiconductor layer (11), a p-connecting contact (3), which is configured for electrically contacting the p-doped semiconductor layer (12), the n-connecting contact (2) being arranged on the side of the semiconductor layer sequence (1) facing away from the carrier (7), the n-connecting contact (2) having a first side (4) which is arranged facing the semiconductor layer sequence (1), wherein the first side (4) has two outer regions (43) and an inner region (44), viewed in lateral cross-section, which is delimited by the outer regions (43), wherein the outer regions (43) of the first side (4) are unstructured (42), and wherein the inner region (44) is structured (41).

15 Claims, 4 Drawing Sheets

(56) References Cited

U.S. PATENT DOCUMENTS

Figure 1:
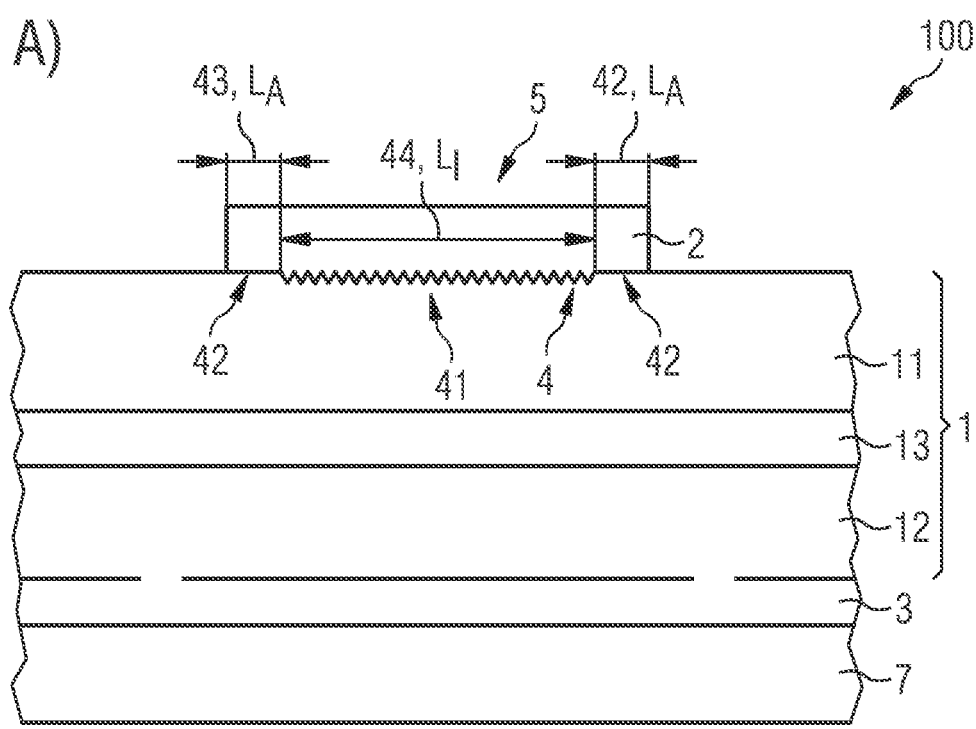
Figure 1:
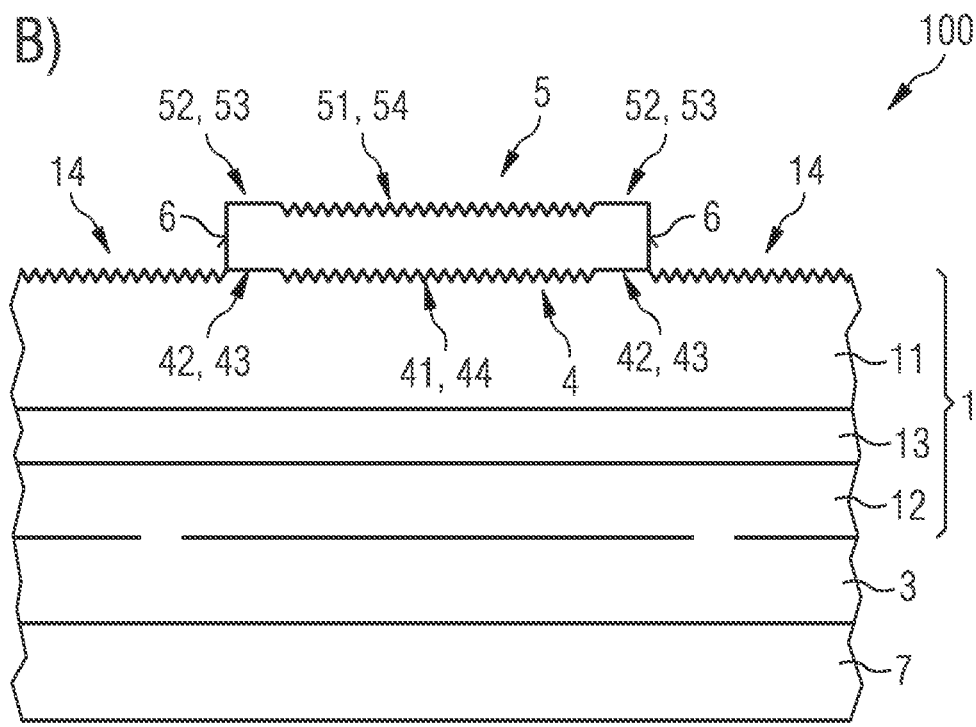

| | | |
|---|---|---|
| 2011/0133242 A1 | 6/2011 | Choi et al. |
| 2011/0291136 A1 | 12/2011 | Hung et al. |
| 2014/0034981 A1 | 2/2014 | Hung et al. |
| 2015/0236205 A1 | 8/2015 | Chung et al. |
| 2015/0255682 A1 | 9/2015 | Yin et al. |

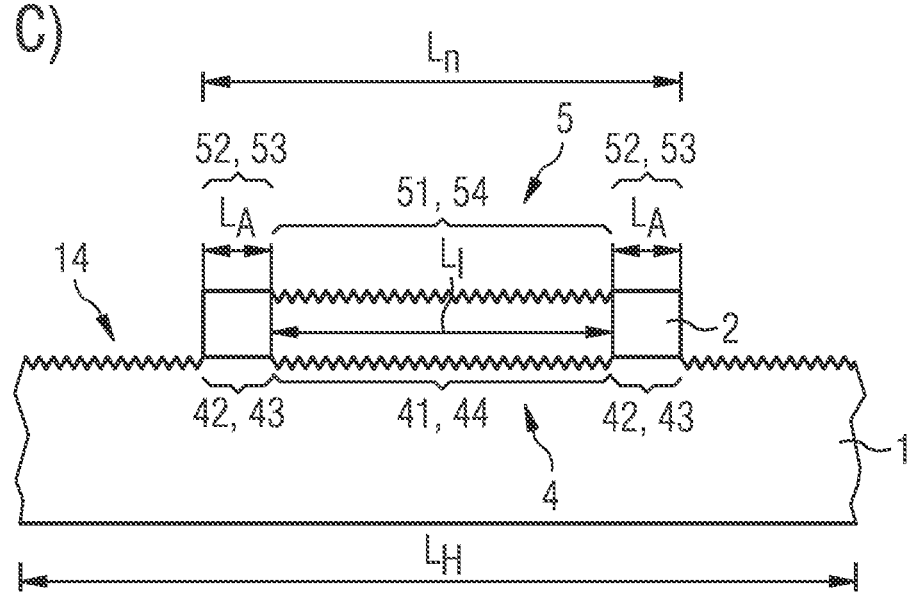

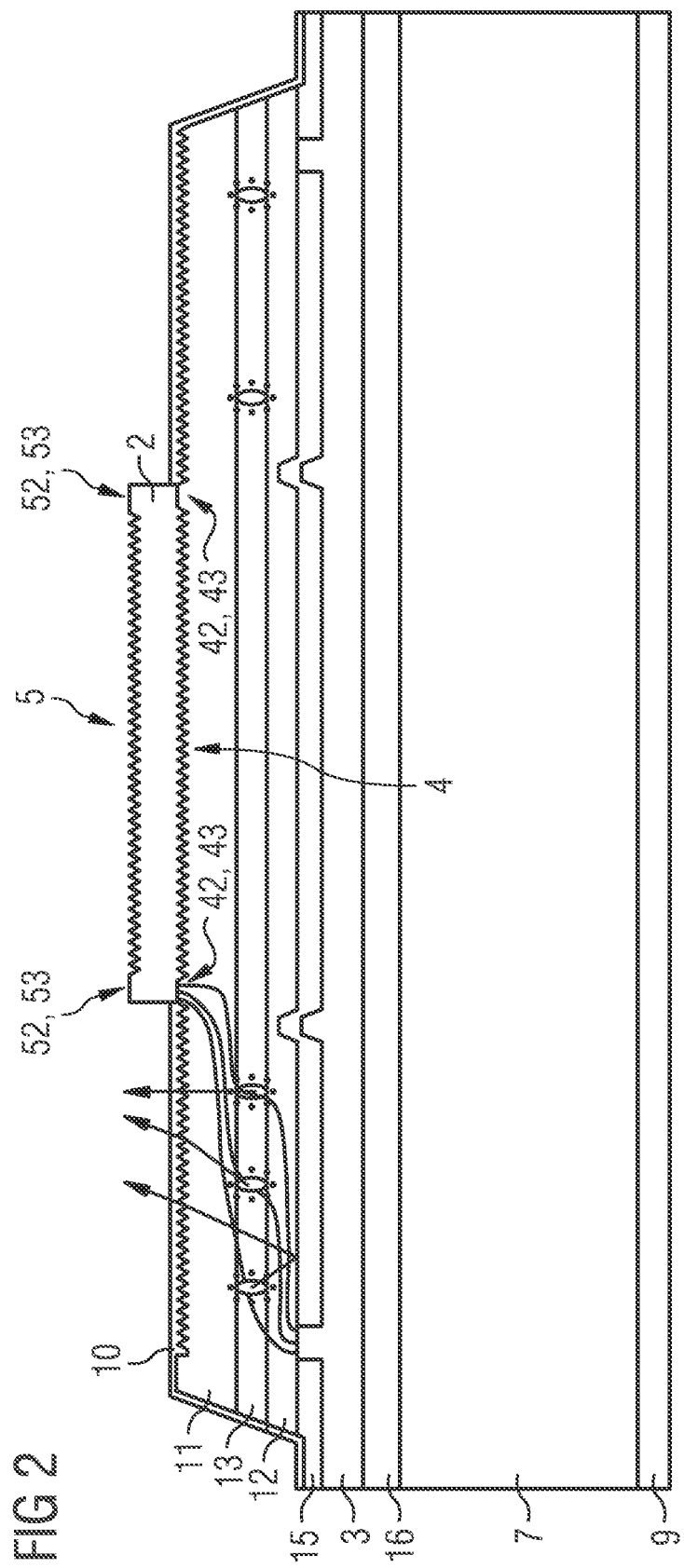

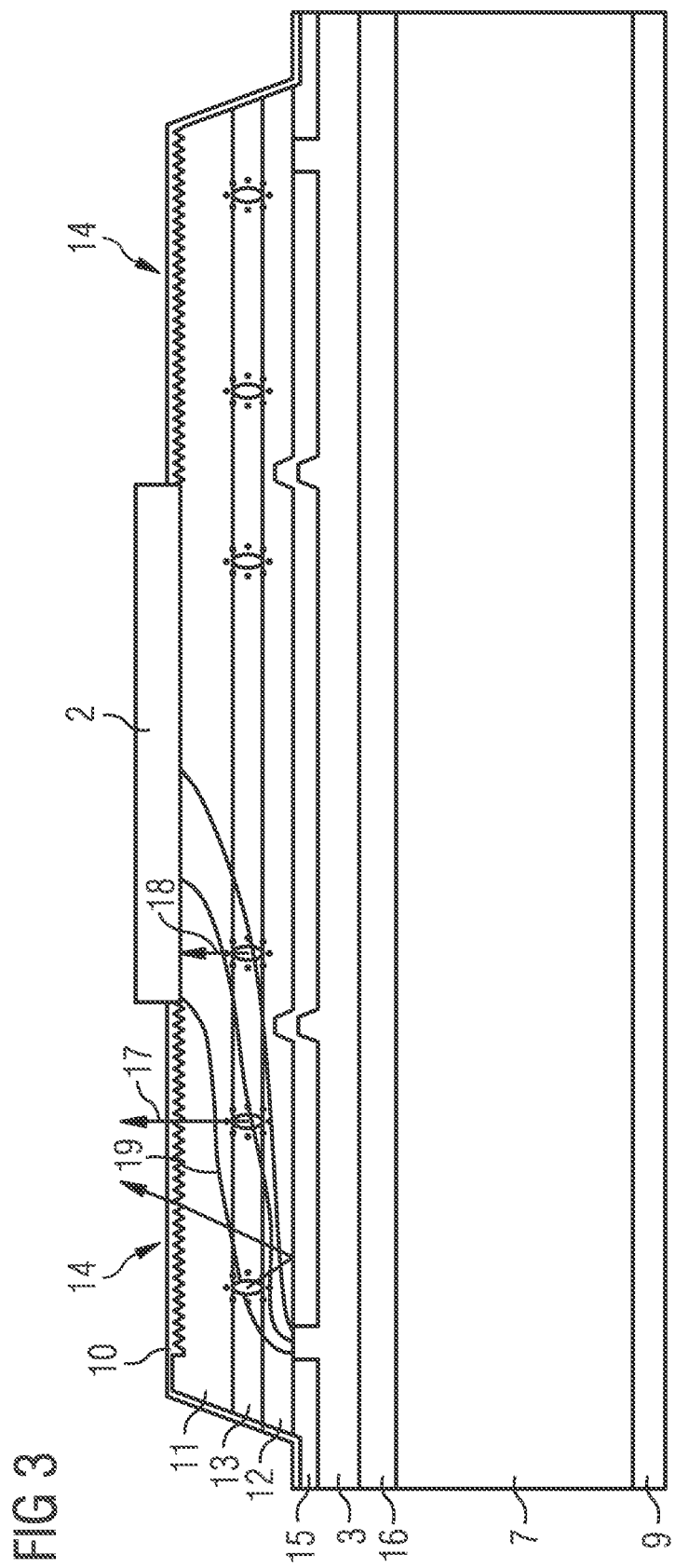

OPTOELECTRONIC COMPONENT AND METHOD FOR PRODUCING AN OPTOELECTRONIC COMPONENT

CROSS-REFERENCE TO RELATED APPLICATION(S)

This application is a national stage entry from International Application No. PCT/EP2018/067603, filed on Jun. 29, 2018, published as International Publication No. WO 2019/025091 A1 on Feb. 7, 2019, and claims priority under 35 U.S.C. § 119 from German Patent Application No. 102017117613.6, filed on Aug. 3, 2017, the entire contents of all of which are incorporated herein by reference.

The invention relates to an optoelectronic device. Furthermore, the invention relates to a method for producing an optoelectronic device.

Optoelectronic devices such as light-emitting diodes, in particular with a semiconductor layer sequence of indium gallium aluminium phosphide, typically have p-connecting contacts which are formed smooth. Rough p-contacts cannot be used over the entire surface in this case because of the very thin current expansion layer (CEL). The current expansion layer would then be partially or completely removed.

An object of the invention is to provide an improved optoelectronic device. In particular, the light extraction of the optoelectronic device is to be improved. Furthermore, it is an object of the invention to provide a method for producing of an optoelectronic device which produces an improved optoelectronic device.

This object is, or these objects are, solved by an optoelectronic device according to claim 1. Furthermore, these objects are or will be solved by a method for producing an optoelectronic device according to claim 15. Advantageous embodiments and further development of the invention are the subject matter of the dependent claims.

In at least one embodiment, the optoelectronic device has a semiconductor layer sequence. The semiconductor layer sequence is arranged on a carrier. The semiconductor layer sequence has at least one n-doped semiconductor layer, at least one p-doped semiconductor layer and an active layer arranged between the p- and n-doped semiconductor layers. The device has an n-connecting contact. The n-connecting contact is configured for electrical contacting of the at least one n-doped semiconductor layer. The device has a p-connection contact. The p-connecting contact is configured for electrical contacting of the at least one p-doped semiconductor layer. The n-connecting contact is arranged on the side of the semiconductor layer sequence facing away from the carrier. The reconnecting contact has a first side. The first side is arranged facing the semiconductor layer sequence. The first side of the n-connecting contact, viewed in the lateral cross-section, has two outer regions and an inner region. The inner region is delimited by the two outer regions, in particular directly mechanically and/or electrically. The outer regions of the first side are formed unstructured. The inner region of the first side is formed structured. In plan view of the first side of the n-connecting contact, the inner region can be partially surrounded by the outer regions. Furthermore, it is possible that the two outer regions form a single outer region in plan view, which outer region surrounds the inner region frame-like or ring-like and completely encloses it laterally.

The invention also relates to a method for producing an optoelectronic device. Preferably, the optoelectronic device described here is produced with this method. All definitions and embodiments of the optoelectronic device also apply to the method and vice versa.

According to at least one embodiment, the method for producing an optoelectronic device comprises at least the steps, in particular in the order given here:

A) providing a carrier;
B) applying a p-connecting contact for electrical contacting of at least one p-doped semiconductor layer;
C) applying a semiconductor layer sequence on the p-connecting contact, wherein the semiconductor layer sequence has at least one n-doped semiconductor layer, at least one p-doped semiconductor layer and an active layer arranged between the p- and n-doped semiconductor layers;
D) applying an n-connecting contact on the semiconductor layer sequence, which is configured for electrically contacting the at least one n-doped semiconductor layer, the n-connecting contact has a first side, which is arranged facing the semiconductor layer sequence, wherein the first side, viewed in the lateral cross-section, has two outer regions and an inner region, which is delimited by the outer sides, wherein the outer regions of the first side are unstructured and the inner region is structured.

The inventor has recognized that the optoelectronic device described here and the production method thereof, a device can be provided, which has improved light extraction. In addition, the contrast, for example in displays, such as for video walls or NPP applications, can be improved by avoiding undesired reflections in the connection contact.

Until now, it has not been possible to produce rough contact structures, in particular rough n-connecting contacts, because of the very thin CEL. The CEL would then be partially or completely removed.

The optoelectronic device described here has an n-connecting contact, which is arranged on the semiconductor layer sequence. The n-connecting contact is formed unstructured in the outer regions, whereas the inner region is structured. In other words, the n-connecting contact has a narrow, smooth, unstructured frame, while the remaining region, i.e. in particular the inner region of the n-connecting contact, is roughened. This enables current injection at the edge, i.e. in the outer region, which also reduces the absorption below the n-connecting contact.

According to at least one embodiment, the lateral extent of the respective unstructured outer region is a multiple times smaller than the lateral extent of the structured inner region. The lateral extent of the respective unstructured outer region is in particular between 2 µm and 10 µm. The lateral extent of the structured inner region is in particular between 25 µm and 150 µm.

According to at least one embodiment, the roughness of the respective outer region is less than 100 nm, in particular less than or equal to 80 nm or 50 nm.

According to at least one embodiment, the roughness of the respective inner region is larger than 300 nm, in particular larger than or equal to 350 nm or 500 nm.

The large-area roughening of the inner region with the narrow unstructured outer regions, in particular with a lateral extent of the respective outer regions between 2 µm and 10 µm, enables a reduction of the surface reflection and thus an improvement of the contrast in the application, for example for displays. In other words, the optoelectronic device described here can improve the light yield and increase the contrast.

The term 'structured' can mean here and in the following in particular that the inner region has roughening. Here, roughening means in particular an average roughness. The average roughness is sufficiently known to the person skilled in the art and is therefore not explained here. The 'unstructured outer region' can mean here and in the following that the outer region is smooth, i.e. has no significant average roughness. By 'no significant roughness' is meant a roughness of 100 nm.

According to at least one embodiment, the two outer regions each have a lateral extent of between 2 μm and 10 μm. By forming the n-connecting contact with a smooth outer region or smooth outer regions and a roughened inner region, the light extraction from the optoelectronic device can be improved. There is no reflection of the radiation below the roughened inner region, whereas in the smooth outer region the radiation is reflected and can easily be coupled out from the device, which leads to an increase in the light coupled out of the whole device.

According to at least one embodiment, no recombination of radiation occurs below the inner region of the first side in the semiconductor layer sequence, wherein a recombination occurs in the active layer in the region below the outer regions of the n-connecting contact and in the semiconductor layer sequence, which is not covered by the n-connecting contact.

According to at least one embodiment, the n-connecting contact is arranged on the side of the semiconductor layer sequence facing away from the carrier. The n-connecting contact has a second side, which is arranged facing away from the semiconductor layer sequence. The second side, viewed in lateral cross-section, has two outer regions, here called two further outer regions, and a further inner region, which is delimited by the further outer regions. The embodiments and definitions of the outer regions apply equally to the further outer regions and vice versa. Also, the embodiments and definitions of the inner region apply here and in the following equally to the further inner region and vice versa. In plan view of the second side of the n-connecting contact, the inner region can be partially surrounded by the further outer regions. Furthermore, it is possible that the two further outer regions form a single further outer region in plan view, which surrounds the inner region frame-like or ring-like and completely encloses it laterally.

According to at least one embodiment, the structuring of the inner region of the first side is equal to the structuring of the inner region of the second side. This is due in particular to the production method. Preferably, the surface of the semiconductor layer sequence has a structuring over the entire surface, with the exception of the regions covered by the outer regions. Subsequently, the n-connecting contact can be applied, which has a first side facing the semiconductor layer sequence and a second side facing away from the semiconductor layer sequence. The structuring of the semiconductor layer sequence is continued when the n-connecting contact is applied over the surface of the first side and, if appropriate, over the surface of the second side. In other words, the surface topology of the semiconductor layer sequence is also repeated in the first and/or second side of the n-connecting contact. If the semiconductor layer sequence is unstructured in the region of the outer regions and/or further outer regions, the outer regions and/or further outer regions are unstructured. If the semiconductor layer sequence is structured in the region of the inner region and/or further inner region, the inner region and/or further inner region is structured.

According to at least one embodiment, the n-connecting contact has a material or a combination of materials selected from the following group: gold, germanium, gold germanium, nickel, titanium, platinum.

According to at least one embodiment, the n-connecting contact and/or p-connecting contact has or consists of a transparent conductive oxide (TCO).

Transparent, electrically conductive oxides (TCO) are transparent, electrically conductive materials, typically metal oxides, such as zinc oxide, tin oxide, cadmium oxide, titanium oxide, indium oxide, indium tin oxide (ITO) or aluminium zinc oxide (AZO). In addition to binary metal oxygen compounds such as ZnO, SnO2 or In2O3, ternary metal oxygen compounds such as Zn2SnO4, CdSnO3, ZnSnO3, MgIn2O4, GaInO3, Zn2In2O5 or In4Sn3O12 or mixtures of different transparent conductive oxides also belong to the group of TCOs. Furthermore, the TCOs do not necessarily correspond to a stoichiometric composition and can also be p- or n-doped. Preferably, the n-connecting contact and/or p-connecting contact is ITO.

According to at least one embodiment, the p-connecting contact extends horizontally between the carrier and the semiconductor layer sequence.

According to at least one embodiment, a carrier of silicon or germanium, for example, can serve as a carrier. Alternatively, the carrier can be formed from at least one metal, ceramic, sapphire, hard carrier, such as plastic. In general, the carrier in particular is formed to be electrically conductive.

According to at least one embodiment, the optoelectronic semiconductor device is a light-emitting diode, or LED for short. The device is therefore preferably configured to emit blue or white light.

According to at least one embodiment, the device has a p-connecting contact. In other words, the p-connecting contact forms the p-contact of the optoelectronic semiconductor chip. For example, the p-connecting contact can have a bond pad or one or more contact bars.

The n-connecting contact electrically contacts the n-doped semiconductor layer. In other words, the n-connecting contact forms the n-contact of the optoelectronic device. For example, the n-connecting contact can have a bond pad and/or one or more contact bars.

According to at least one embodiment of the optoelectronic device, it comprises at least one semiconductor layer sequence. The semiconductor layer sequence comprises at least one n-doped semiconductor layer, at least one p-doped semiconductor layer and active layers arranged between the two doped semiconductor layers. The semiconductor layers of the device are preferably based on a III-V compound semiconductor material. The compound semiconductor material can preferably be based on a nitride, phosphide or arsenide compound semiconductor material. The semiconductor material is for example a nitride compound semiconductor material such as $Al_n In_{1-n-m} Ga_m N$ or a phosphide compound semiconductor material such as $Al_n In_{i-n-m} Ga_m P$ or also an arsenide compound semiconductor material such as $Al_n In_{1-n-m} Ga_m As$, where $0 \leq n \leq 1$, $0 \leq m \leq 1$ and $n+m \leq 1$, respectively. The semiconductor layer sequence may have dopants as well as additional constituents. For the sake of simplicity, however, only the essential constituents of the crystal lattice of the semiconductor layer sequence, i.e. Al, As, Ga, In, N or P, are given, even though these can be partially replaced and/or supplemented by small amounts of other substances.

The optoelectronic device includes an active layer with at least one pn-junction and/or with one or more quantum well structures. During operation of the device, electromagnetic radiation is generated in the active layer. A wavelength or a wavelength maximum of the radiation is preferably in the ultraviolet and/or visible range, in particular for wavelengths between 420 nm and 680 nm inclusive, for example between 440 nm and 480 nm inclusive.

According to at least one embodiment, the n-connecting contact has side surfaces. The sides are arranged vertically to the first and second side. The side surfaces are preferably unstructured, i.e. in particular smooth. 'Smooth' here and in the following means a surface according to the structuring with a photomask (lift-off or active).

According to at least one embodiment, the semiconductor layer sequence is structured on the side facing the n-connecting contact and not covered by the n-connecting contact. In particular, the structuring is the same as the structuring of the first side or the structuring of the surface of the semiconductor layer sequence, which is in direct contact with the n-connecting contact via the first side.

According to at least one embodiment, the lateral extent of the n-connecting contacts, viewed in the lateral cross-section, is smaller than the lateral extent of the semiconductor layer sequence. For example, the lateral extent of the n-connecting contact is smaller than the lateral extent of the semiconductor layer sequence by a factor of 2, 3, 4, 5 or 6.

According to at least one embodiment, the n-connecting contact, viewed in lateral cross-section, is centred on the semiconductor layer sequence.

According to at least one embodiment, the semiconductor layer sequence is formed structured, in particular formed structured over the entire surface, on the side opposite the carrier. The term 'structured' is used here in particular to describe a roughened surface.

According to at least one embodiment, the structuring has a roughening with an average roughness between 500 nm and 1000 nm, in particular between 600 nm and 800 nm, in particular preferably between 650 nm and 750 nm, for example 600 nm.

According to at least one embodiment, the device has a conversion element, also known as a converter element. The conversion element has at least one conversion material, also known as phosphor. The conversion material is configured to convert the radiation emitted by a semiconductor chip, for example, into radiation with a modified wavelength. In particular, any conventional conversion material or conventional phosphors can be used as conversion material. For example, the following conversion materials can be used: Europium-doped nitrides, such as $(Ca,Sr)AlSiN_3$:$Eu^{2+}$, Sr $(Ca, Sr) Si_2Al_2N_6$:$Eu^{2+}$, $(Sr, Ca) AlSiN_3*Si_2N_2O$:$Eu^{2+}$, $(Ca,Ba,Sr)_2Si_5N_8$:$Eu^{2+}$, $(Sr,Ca)[LiAl_3Nd$:$Eu^{230}$; garnets, such as $(Gd,Lu,Tb,Y)_3(Al,Ga,D)_5(O,X)_{12}$:RE where X=halogen, N or divalent elements, D=tri- or tetravalent elements and RE=rare earth metals such as $Lu_3(Al_{1-x}Ga_x)_5O_{12}$:$Ce^{3+}$, $Y_3(Al_{1-x}Ga_x)_5O_{12}$:$Ce^{3+}$; europium-doped sulfides, such as $(Ca,Sr,Ba)S$:$Eu^{2+}$; SiAlONs, such as $Li_xM_yLn_zSi_{12-(n+n)} Al_{(m+n)} O_nN_{16-n}$; beta-SiAlONs, such as $Si_{6-x}Al_zO_yN_{8-y}$: $RE_z$; nitride orthosilicates, such as $AE_{2-x-a}RE_xEu_aSiO_{4-x}N_x$, $AE_{2-x-a}RE_xEu_aSi_{1-y}O_{4-x-2y}N_x$ where RE=rare earth metals and AE=alkaline earth metal; chlorosilicates, such as $Ca_8Mg(SiO_4)_zC_{12}$:$Eu^{2+}$; chlorophosphates, such as $(Sr,Ba,Ca,Mg)_{10}(PO_4)_6C_{12}$:$Eu^{2+}$; BAM-luminescent materials from the barium oxide, magnesium oxide and aluminium oxide system, such as $BaMgAl_{10}O_{17}$:$Eu^{2+}$; halogen phosphates, such as $M_5(PO_4)_3(Cl,F)$:$(Eu^{2+},Sb^{3+},Mn^{2+}$; SCAP-luminescent materials, such as $(Sr,Ba,Ca)_5(PO_2)_3C_1$:$Eu^{2+}$. Conversion materials as described in EP 2549330 A1 can also be used.

Quantum dots can also be used as conversion materials. The quantum dots can, in the form of nanocrystalline materials, have materials from the group of II-VI compounds and/or from the group of III-V compounds and/or from the group of IV-VI compounds and/or metal nanocrystals. Preferably, the quantum dots contained in the conversion material are not toxic.

Further advantages, advantageous embodiments and further developments result from the exemplary embodiments described below in connection with the figures.

They show:

FIGS. 1A, 1B and 1C each a schematic side view of an optoelectronic device according to an exemplary embodiment.

FIG. 2 a schematic side view of an optoelectronic device according to an exemplary embodiment, and FIG. 3 a schematic side view of an optoelectronic device according to a comparison example.

In the exemplary embodiments and figures, identical, similar and similar-acting elements can each be provided with the same reference sign. The elements shown and their proportions among one another are not to be regarded as true to scale. Rather, individual elements such as layers, components, devices and regions can be shown in an exaggerated size for better representation and/or understanding.

FIG. 1A shows a schematic side view of an optoelectronic device according to an exemplary embodiment.

Device 100 has a carrier 7, for example made of silicon or germanium.

On this carrier 7 a p-connecting contact 3 is arranged, which serves for electrical contacting of the at least one p-doped semiconductor layer 12.

The device has a semiconductor layer sequence 1, which has at least one n-doped semiconductor layer 11, an active layer 13 and at least one p-doped semiconductor layer 12.

Above the n-doped semiconductor layer, which consists in particular of a phosphide compound such as InGaAlP, an n-connecting contact 2 is arranged.

The n-connecting contact 2 has a first side 4 and a second side 5 facing away from the carrier 7.

The first side 4 is arranged between the n-doped semiconductor layer 11 and the second side 5, in particular in direct contact with the surface of the n-doped semiconductor layer 11.

The first side 4 has outer regions 43 and an inner region 44.

The lateral extent of the outer regions $L_A$ is a multiple times smaller than the lateral extent of the inner region $L_I$. For example, the lateral extent of the respective outer region 43 is between 2 μm and 10 μm.

Device 100 of FIG. 1A shows an unstructured second side 5. Alternatively, as shown in FIG. 1B, this second side 5 can also be structured. In particular, the second side 5 has the same structure as the first side 4.

Preferably, the structuring of the first and/or second side 4, 5 is identical with the surface structuring of the semiconductor layer sequence 1, in particular the surface structuring of the at least one n-doped semiconductor layer 11. The outer regions of the first and second side 43, 53 are each smooth.

In addition, the side surfaces 6 of the n-connecting contact 2 are smooth, i.e. formed unstructured.

The surface of the semiconductor layer sequence 1 is formed 14 structured. In particular, the surface of the semiconductor layer sequence 1, the surface of the first side 4 and the surface of the second side 5 have the same surface topology. This is due in particular to the production method.

FIG. 1C shows a schematic side view of an optoelectronic device according to an exemplary embodiment. Here again a section of the semiconductor layer sequence 1 and the n-connecting contact 2 is shown. The lateral extent of the n-connecting contact $L_n$ is smaller than the lateral extent of the semiconductor layer sequence 1 $L_H$. In particular, the lateral extent of the n-connecting contact is smaller by a factor of 1.5 to 20 than the lateral extent of the semiconductor layer sequence 1.

The first side 4 shows a structuring 41 of the inner region 44. The first side 4 has no structuring in the outer regions, i.e. unstructured outer regions 42, 43. The same applies to the second side 5. The second side 5 has a structuring 51 in the inner region 54 and no structuring 52 in the outer regions 53.

FIG. 2 shows a schematic side view of an optoelectronic device 100 according to an exemplary embodiment.

The optoelectronic device has a carrier 7 made of silicon. A contact connection 9, e.g. made of platinum gold, is arranged below the carrier 7.

A solder 16 is arranged above the carrier 7, which for example has ITOAuTiNiAu and/or InSnInNiTiAuPt.

A p-connecting contact 3, in particular a current-carrying p-metal, for example made of ITO, gold, titanium, nickel and gold, is arranged above the solder 16.

A semiconductor layer sequence 1 with an n-doped semiconductor layer 11, an active layer 13 and a p-doped semiconductor layer 12 can be arranged above it.

A dielectric mirror 15, for example made of silicon oxide on ITOAu, can be arranged between the p-connecting contact 3 and the semiconductor layer sequence 1.

Above the semiconductor layer sequence 1, the n-connecting contact 2, which here has a structuring in the first side 4 as well as in the second side 5, can be arranged. In the edge regions of the n-connecting contact 2, the outer regions 43, 53 are formed smooth. In addition, the side surfaces 6 of the n-connecting contact 2 can be formed smooth.

On the device, in particular on the surface of the semiconductor layer sequence 1, which is not covered by the n-connecting contact 2, a passivation layer 10, for example made of silicon nitride, can be arranged.

Due to the centrally roughened n-connecting contact 2 in the inner region, the current can only flow via the side edges, i.e. the outer regions, in the direction of the p-connecting contact 3. Thus, there is no recombination below the n-connecting contact 2. The absorption is reduced. In addition, the n-connecting contact 2 no longer reflects light incident from outside. The contrast in displays, for example in video walls and NPP (Narrow Pixel Pitch), is significantly improved.

FIG. 3 shows a schematic side view of an optoelectronic device according to a comparison example.

In principle, the optoelectronic device 100 described here is constructed similar to the optoelectronic device described in FIG. 2, with the exception of the configuration of the reconnecting contact 2.

In comparison to the device invented here, the n-connecting contact 2 of the comparison example is formed completely smooth. In other words, it has no outer or inner regions with different structures, but both the first side 4 and the second side 5 and the sides are formed smooth.

Due to the whole-area smooth n-connecting contact 2, the current impressing is distributed over the whole n-contact surface of the n-connecting contact 2, which favours recombination below this n-connecting contact 2. As a result, most of the light is lost through absorption at the n-connecting contact 2, so that the light yield of a device according to the comparison example is smaller than the light yield of an optoelectronic device described here according to at least one exemplary embodiment. The reference signs 17 show the light path, 18 the absorption below the n-connecting contact and 19 the current flow.

The exemplary embodiments described in connection with the Figures and their features can also be combined with one another according to further exemplary embodiments, even if such combinations are not explicitly shown in the Figures. Furthermore, the exemplary embodiments described in connection with the Figures can have additional or alternative features as described in the general part.

The invention is not limited to the description by means of the exemplary embodiments. Rather, the invention comprises any new feature, as well as any combination of features, which includes in particular any combination of features in the claims, even if that feature or combination itself is not explicitly stated in the claims or exemplary embodiments.

This patent application claims the priority of the German patent application 10 2017 117 613.6, the disclosure content of which is hereby incorporated by reference.

REFERENCE SIGNS LIST

100 optoelectronic device
1 Semiconductor layer sequence
11 n-doped semiconductor layer
12 p-doped semiconductor layer
13 active layer
14 structured semiconductor layer sequence
2 n-connecting contact
3 p-connecting contact
4 first side
41 structured first side
42 unstructured first side
43 outer regions of the first side
44 inner region of the first side
5 second side
51 structured second side
52 unstructured second side
53 outer regions of the second side
54 inner region of the second side
6 side surfaces of the n-connecting contact
7 carrier
$L_A$ lateral extent of the outer region
$L_I$ lateral extent of the inner region
16 solder
10 passivation layer
15 mirror
$L_n$ lateral extent of the n-connecting contact
$L_H$ lateral extent of the semiconductor layer sequence
9 contact connection
17 light path
18 absorption
19 current flow

The invention claimed is:

1. An optoelectronic device comprising
a semiconductor layer sequence on a carrier, wherein the semiconductor layer sequence comprises at least one n-doped semiconductor layer, at least one p-doped semiconductor layer and an active layer arranged between the p- and n-doped semiconductor layers,
an n-connecting contact, which is configured for electrically contacting the n-doped semiconductor layer,
a p-connecting contact, which is configured for electrically contacting the p-doped semiconductor layer,
wherein the n-connecting contact is arranged on the side of the semiconductor layer sequence facing away from the carrier,
the n-connecting contact has a first side, which is arranged facing the semiconductor layer sequence, wherein the first side, viewed in the lateral cross-section, has two outer regions and an inner region, which is delimited by the outer regions,
wherein the outer regions of the first side are unstructured, and wherein the inner region is structured, and
wherein no recombination of charge carriers occurs in the active layer below the structured inner region.

2. The optoelectronic device according to claim 1, wherein the two outer regions each have a lateral extent between 2 µm and 10 µm.

3. The optoelectronic device according to claim 1,
wherein no recombination of radiation occurs below the inner region of the first side in the semiconductor layer sequence, wherein a recombination occurs in the active layer in the region below the outer regions of the n-connecting contact and in the semiconductor layer sequence, which is not covered by the n-connecting contact.

4. The optoelectronic device according to claim 1,
wherein the n-connecting contact is arranged on the side of the semiconductor layer sequence facing away from the carrier, wherein the n-connecting contact has a second side, which is arranged facing away from the semiconductor layer sequence,
wherein the second side, viewed in lateral cross-section, has two further outer regions and a further inner region, which is delimited by the further outer regions.

5. The optoelectronic device according to claim 1,
wherein the structuring of the inner region of the first side is equal to the structuring of the inner region of the second side.

6. The optoelectronic device according to claim 1,
wherein the n-connecting contact has a material or a combination of materials selected from the following group: gold, germanium, gold germanium, nickel, titanium, platinum.

7. The optoelectronic device according to claim 1,
wherein the p-connecting contact extends horizontally between the carrier and the semiconductor layer sequence.

8. The optoelectronic device according to claim 1,
wherein the n-connecting contact has side surfaces, which are arranged vertically to the first and second side, wherein the side surfaces are unstructured.

9. The optoelectronic device according to claim 1,
wherein the semiconductor layer sequence is structured on the side, which faces the n-connecting contact and which is not covered by the n-connecting contact.

10. The optoelectronic device according to claim 1,
wherein the lateral extent of the n-connecting contact, viewed in lateral cross-section, is smaller than the lateral extent of the semiconductor layer sequence.

11. The optoelectronic device according to claim 1,
wherein the n-connecting contact, viewed in the lateral cross-section, is arranged centred on the semiconductor layer sequence.

12. The optoelectronic device according to claim 1,
wherein the carrier is formed of silicon or germanium.

13. The optoelectronic device according to claim 1,
wherein the semiconductor layer sequence is structured on the side opposite the carrier.

14. The optoelectronic device according to claim 1,
wherein the structuring is a roughening with an average roughness between 500 nm and 1000 nm.

15. A method for producing an optoelectronic device according to claim 1, comprising the steps
A) providing a carrier,
B) applying a p-connecting contact for electrical contacting of at least one p-doped semiconductor layer,
C) applying a semiconductor layer sequence on the p-connecting contact, wherein the semiconductor layer sequence has at least one n-doped semiconductor layer, at least one p-doped semiconductor layer and an active layer arranged between the p- and n-doped semiconductor layers,
D) applying an n-connecting contact on the semiconductor layer sequence, which is configured for electrically contacting the at least one n-doped semiconductor layer,
the n-connecting contact has a first side, which is arranged facing the semiconductor layer sequence,
wherein the first side, viewed in the lateral cross-section, has two outer regions and an inner region, which is delimited by the outer regions,
wherein the outer regions of the first side are unstructured, and wherein the inner region is structured, and
wherein no recombination of charge carriers occurs in the active layer below the structured inner region.

* * * * *

UNITED STATES PATENT AND TRADEMARK OFFICE
CERTIFICATE OF CORRECTION

| | | |
|---|---|---|
| PATENT NO. | : 11,621,373 B2 | Page 1 of 1 |
| APPLICATION NO. | : 16/635376 | |
| DATED | : April 4, 2023 | |
| INVENTOR(S) | : Guido Weiss | |

It is certified that error appears in the above-identified patent and that said Letters Patent is hereby corrected as shown below:

On the Title Page

Column 2, In the Abstract section, Line 7, "an reconnecting contact (2)," should be --an n-connecting contact (2),--.

Signed and Sealed this
Thirteenth Day of June, 2023

Katherine Kelly Vidal
*Director of the United States Patent and Trademark Office*